United States Patent
Boyle et al.

[11] Patent Number: 6,153,317
[45] Date of Patent: Nov. 28, 2000

[54] PEROVSKITE PHASE THIN FILMS AND METHOD OF MAKING

[75] Inventors: Timothy J. Boyle; Mark A. Rodriguez, both of Albuquerque, N. Mex.

[73] Assignee: Sandia Corporation, Albuquerque, N. Mex.

[21] Appl. No.: 09/128,423

[22] Filed: Aug. 4, 1998

[51] Int. Cl.[7] .................................................. B32B 18/06
[52] U.S. Cl. .......................................... 428/690; 29/25.35
[58] Field of Search ............................ 428/690; 29/25.35

[56] References Cited

U.S. PATENT DOCUMENTS

| | | | |
|---|---|---|---|
| 4,874,598 | 10/1989 | Oda et al. | 423/598 |
| 5,229,101 | 7/1993 | Watanabe et al. | 423/593 |
| 5,683,614 | 11/1997 | Boyle | 252/62.9 |

OTHER PUBLICATIONS

"The System of Mineralogy of Dana", Palache et al, 1952, p. 731 (no month).

Landolt–Bornstein, Numerical Data and Functional Relationships in Science and Technology, Group III: *Crystal and Solid State Physics,* vol. 9, Ferro–and Antiferroelectric Substances, K.Hellwege, ed., 1975, Springer–Verlag, Berlin, (no month).

Haertling, G. and Land, C., "Recent Improvements in the Optical and Electrooptic Properties of PLVT Ceramics," Ferroelectrics, 1972, 3, 269–280, (no month).

Boyle, T., Alam, T., Dimos, D., Moore, G., Buchheit, C., Al–Shareef, H., Mechenbier, E., and Bear, B., Niobium (V) Alkoxides. Synthesis, Structure, and Characterization of [Nb $(\mu\text{–OCH}_2\text{CH}_3)$ $\text{OCH}_2\text{C(CH}_3)_3)_4]_2$, $\{[\text{H}_3\text{CC(CH}_2\text{O})(\text{CH}_2$–$\mu$–O)(C(O)$_2$)]Nb$_2(\mu$–O)(OCH$_2$CH$_3$) $_5\}_2$, and $\{[\text{H}_3\text{CC(CH}_2\text{O})_2(\text{CH}_2$–$\mu$–O)]Nb (OCH$_2$CH$_3)_2\}_2$ for Production of Mixed Metal Oxide Thin Films, Chem. Mater., 1997, 9, 3187–3198, (no month).

*Primary Examiner*—Francis J. Lorin
*Attorney, Agent, or Firm*—Elmer A. Klavetter

[57] ABSTRACT

The present invention comprises perovskite-phase thin films, of the general formula $A_xB_yO_3$ on a substrate, wherein A is selected from beryllium, magnesium, calcium, strontium, and barium or a combination thereof; B is selected from niobium and tantalum or a combination thereof; and x and y are mole fractions between approximately 0.8 and 1.2. More particularly, A is strontium or barium or a combination thereof and B is niobium or tantalum or a combination thereof. Also provided is a method of making a perovskite-phase thin film, comprising combining at least one element-A-containing compound, wherein A is selected from beryllium, magnesium, calcium, strontium or barium, with at least one element-B-containing compound, wherein B niobium or tantalum, to form a solution; adding a solvent to said solution to form another solution; spin-coating the solution onto a substrate to form a thin film; and heating the film to form the perovskite-phase thin film.

10 Claims, 8 Drawing Sheets

PEROVSKITE PHASE THIN FILMS AND METHOD OF MAKING

This invention was made with Government support under Contract No. DE-AC04-94AL85000 awarded by the United States Department of Energy. The Government has certain rights in the invention.

BACKGROUND OF THE INVENTION

The present invention relates generally to perovskite-phase thin films and more particularly to new perovskite phases of the form $A_xB_yO_3$ as thin films and the preparation thereof.

Perovskite-phase materials are of great interest for a wide range of ferroelectric, dielectric, piezoelectric, and actuator applications, including their use in thin film capacitors and micro-electromechanical systems, due to the very high dielectric constant and the electromechanical properties. These materials are classically synthesized by sintering metal oxide mixtures at high temperatures. Lists of materials that form perovskite geometries upon sintering are ubiquitous in the literature. A good summary of perovskite-phase metal oxides is found in Landolt-Bornstein, (Numerical Data and Functional Relationships in Science and Technology, Volume 9, Ferro- and Antiferroelectric Substances, K. Hellwege, ed., 1975). The perovskite phase materials are prepared sometimes as powders and sometimes as thin films.

The perovskite-phase structure is generally described as a simple cubic structure with a cation on the corners, another cation in the body center and oxygen atoms in the center of the faces. Any structure consisting of the corner-linked oxygen octahedra with a cation filling the octahedral hole and another cation filling the dodecahedra hole is regarded as a perovskite structure represented by the general formula $A_xB_yO_3$.

In these perovskite phase materials, because of the –6 valence charge associated with the oxygen atoms, the total valence charge of the metal cations A and B, where A and B may be multiple cations, must equal +6. Examples of perovskite materials, include $BaTiO_3$, with barium having a +2 charge and titanium a +4 charge; $NaTaO_3$, with sodium having a +1 charge and tantalum a +5 charge; $NaNbO_3$, with sodium having a +1 charge and niobium a +5 charge; and $Sr(Cu_{1/3}Nb_{2/3})O_3$ with strontium having a +2 charge, and the copper-niobium mix having an equivalent +4 charge (⅓ copper atom times a valence charge of +2 plus ⅔ niobium atom times a valence charge of +5 equals +4). New perovskite-phase compounds are sought because of the potential for enhanced ferroelectric properties in powder and thin film applications.

Solution routes are widely used for the production of thin films, such as $A_xB_yO_3$ thin films, through spin-cast or dip-coating methodologies. These methods are typically used due to the flexibility in the stoichiometry of precursor solutions, the ease of altering processing variables, cost effectiveness (inexpensive), the reduction of the sintering temperatures, and the capability to integrate with existing semi-conductor processes.

Oda et al., (U.S. Pat. No. 4,874,598, issued on Oct. 17, 1989) and Watanabe et al., (U.S. Pat. No. 5,229,101, issued on Jul. 20, 1993) describe an aqueous solution method of producing a perovskite-type oxide of the $ABO_3$.

Haertling and Land (Ferroelectrics, 1972, Vol. 3, pp. 269–280) describe a sol-gel method of making perovskite-type materials by mixing alkoxide solutions of zirconium and titanium with a lead oxide powder and lanthanum acetate solution, hydrolyzing the solution to form a white-colored solution slurry of paint-like consistency, drying the slurry, crushing the dried product, calcining the product and then crushing and calcining again to obtain a fine-grained powder product, from which films can be prepared.

Boyle et al. (Chem. Mater., 1997, 9, 3187–3198) describe a sol gel process for the preparation of thin films of lead magnesium niobium oxide ferroelectric materials.

Boyle (U.S. Pat. No. 5,683,614, issued on Nov. 4, 1997) describes a sol gel method of forming a bismuth-strontium-tantalum oxide (SBT) ferroelectric material using a solution route process.

SUMMARY OF THE INVENTION

In the present invention disclosed herein, there is disclosed a perovskite-phase thin film, comprising a composition of the general formula $A_xB_yO_3$ on a substrate, wherein A is selected from beryllium, magnesium, calcium, strontium, and barium or a combination thereof; B is selected from niobium and tantalum or a combination thereof; and x and y are mole fractions between approximately 0.8 and 1.2. More particularly, A is strontium or barium or a combination thereof and B is niobium or tantalum or a combination thereof.

Also disclosed is a method of making a perovskite-phase $A_xB_yO_3$ thin film, comprising the steps of combining at least one element-A-containing compound, wherein A is strontium or barium, with at least one element-B-containing compound, wherein B niobium or tantalum, to form a solution; and x and y are mole fractions between approximately 0.8 and 1.2, adding a solvent to said solution to form a second solution; spin-coating the second solution onto a substrate to form a thin film; and heating the film to form the perovskite-phase thin film.

BRIEF DESCRIPTION OF THE DRAWINGS

The accompanying drawings, which are incorporated in and form part of the specification, illustrate embodiments of this invention and, together with the description, serve to explain the principles of the invention.

DETAILED DESCRIPTION OF THE INVENTION

Figure 1:
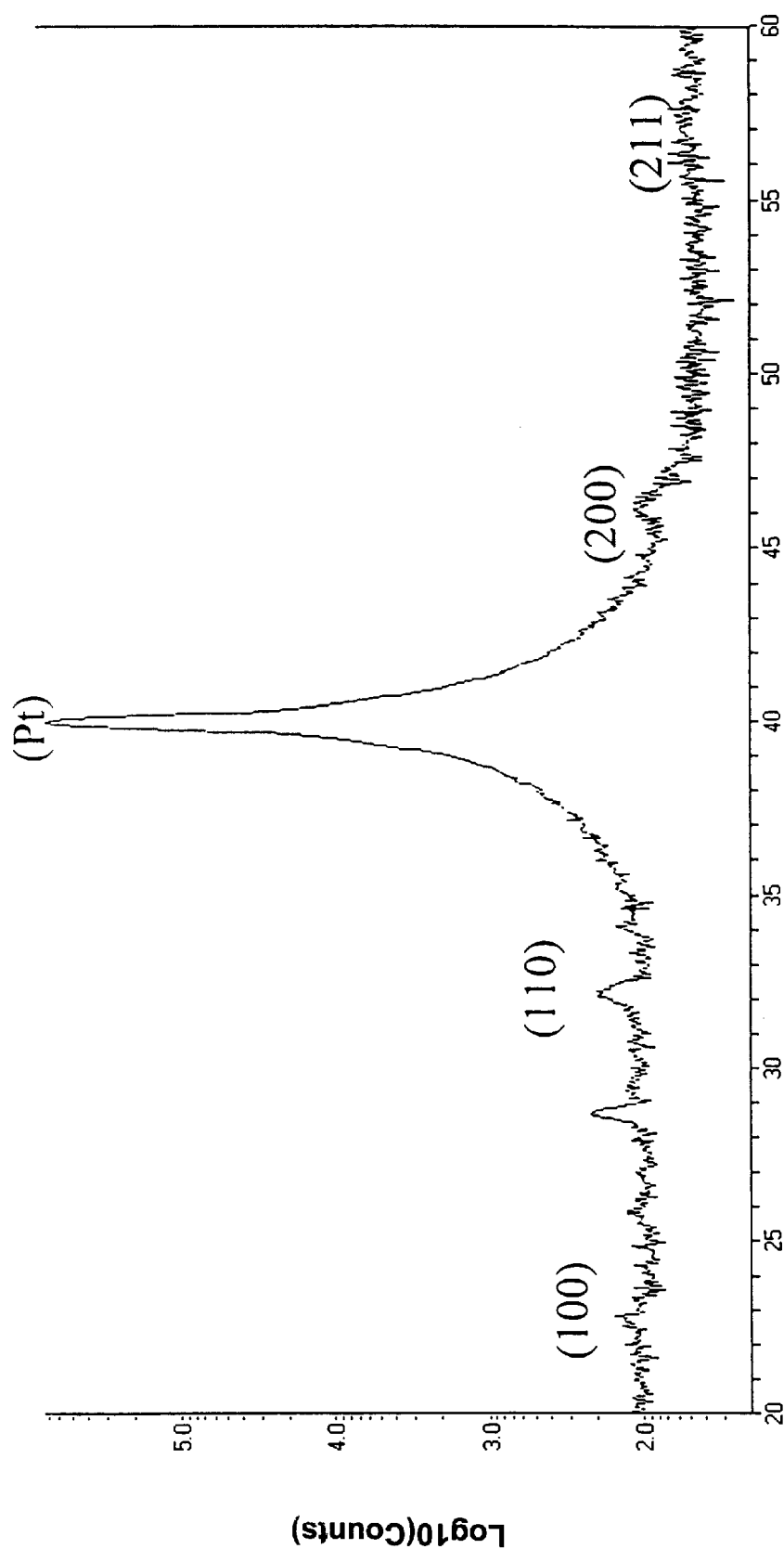
FIG. 1 shows a typical XRD pattern showing the thin film Sr—Nb—O perovskite phase.
Figure 2:
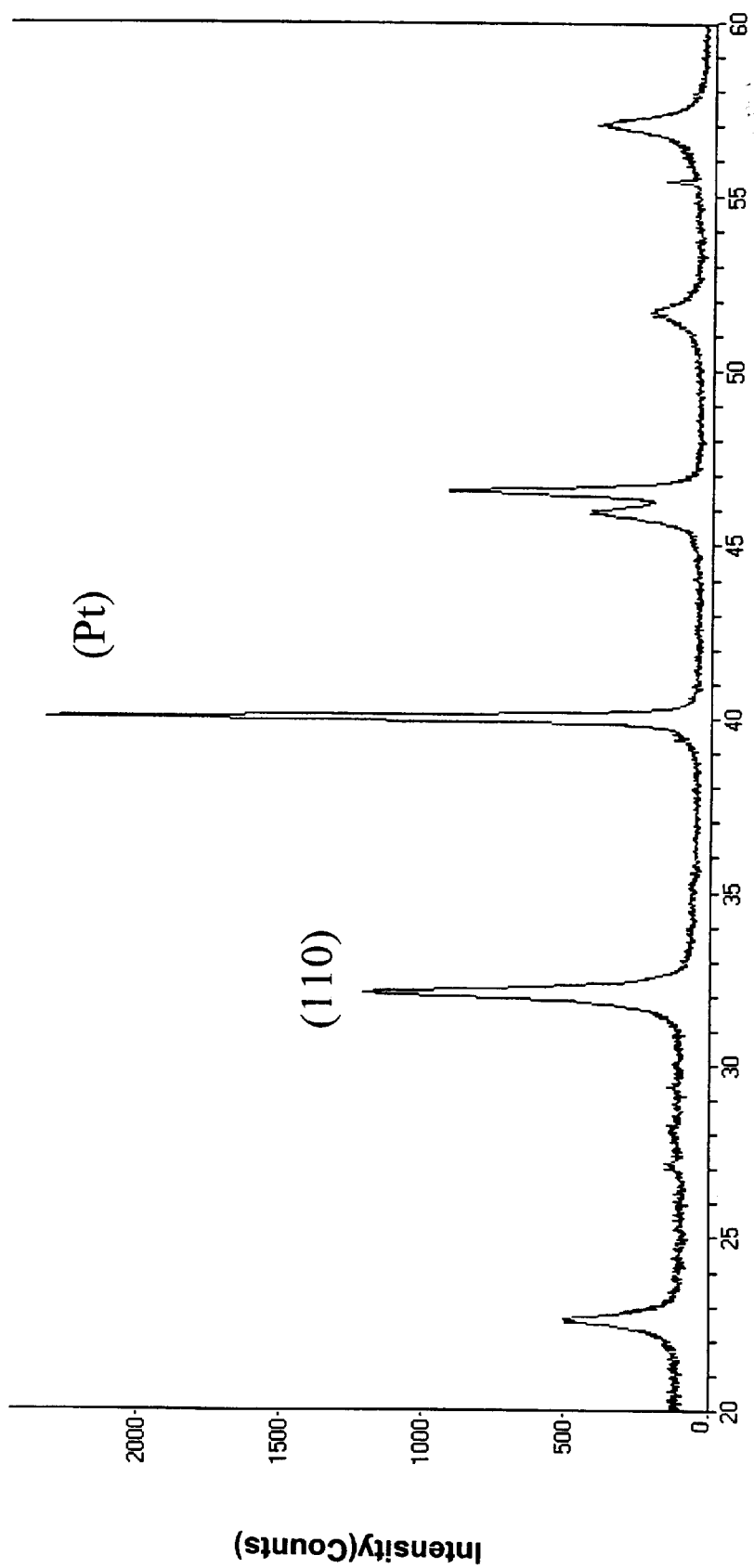
FIG. 2 shows a typical XRD pattern showing the thin film Sr—Ta—O perovskite phase.
Figure 3:
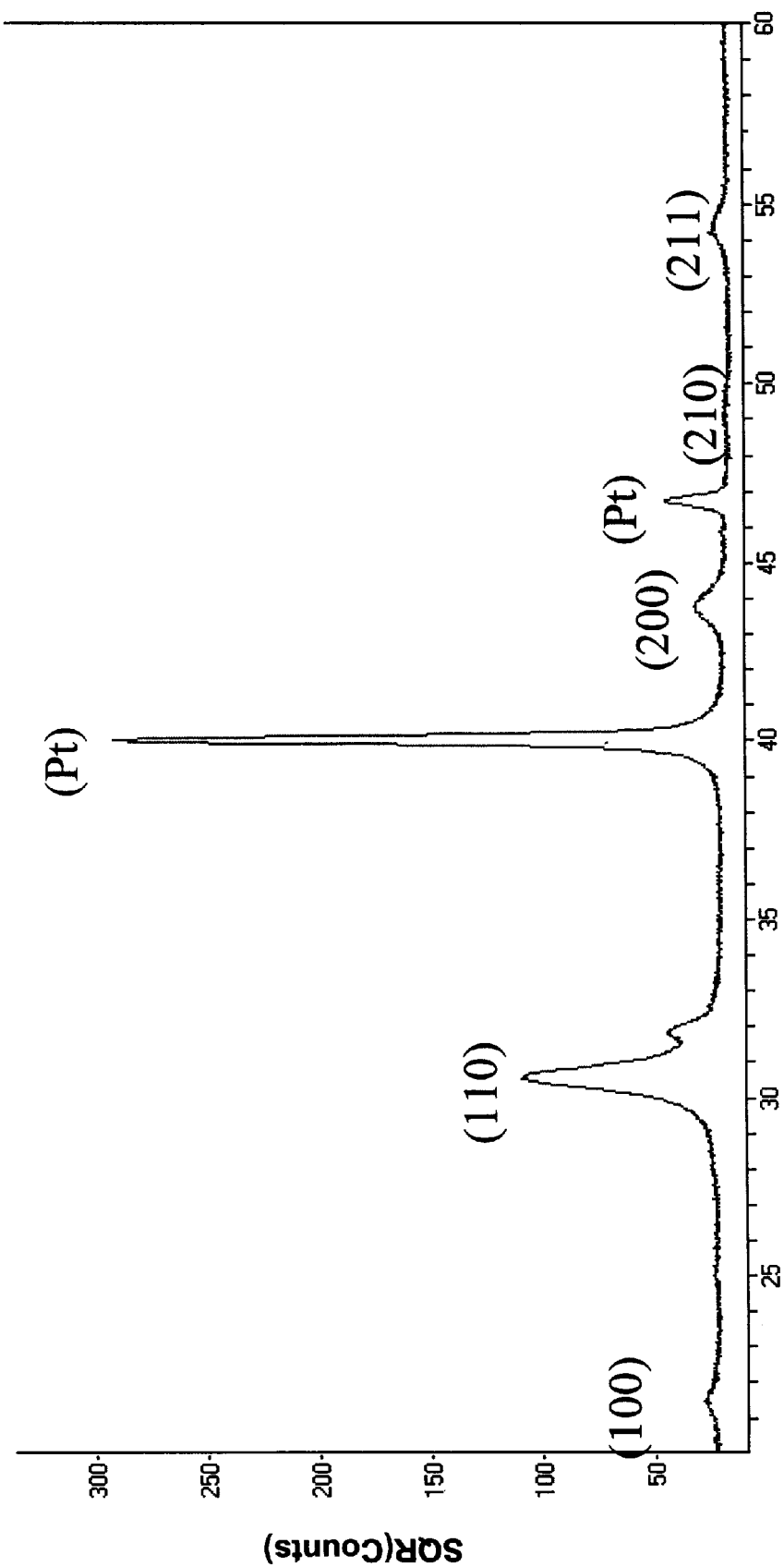
FIG. 3 shows a typical XRD pattern showing the thin film Sr—Nb—Ta—O perovskite phase.
Figure 4:
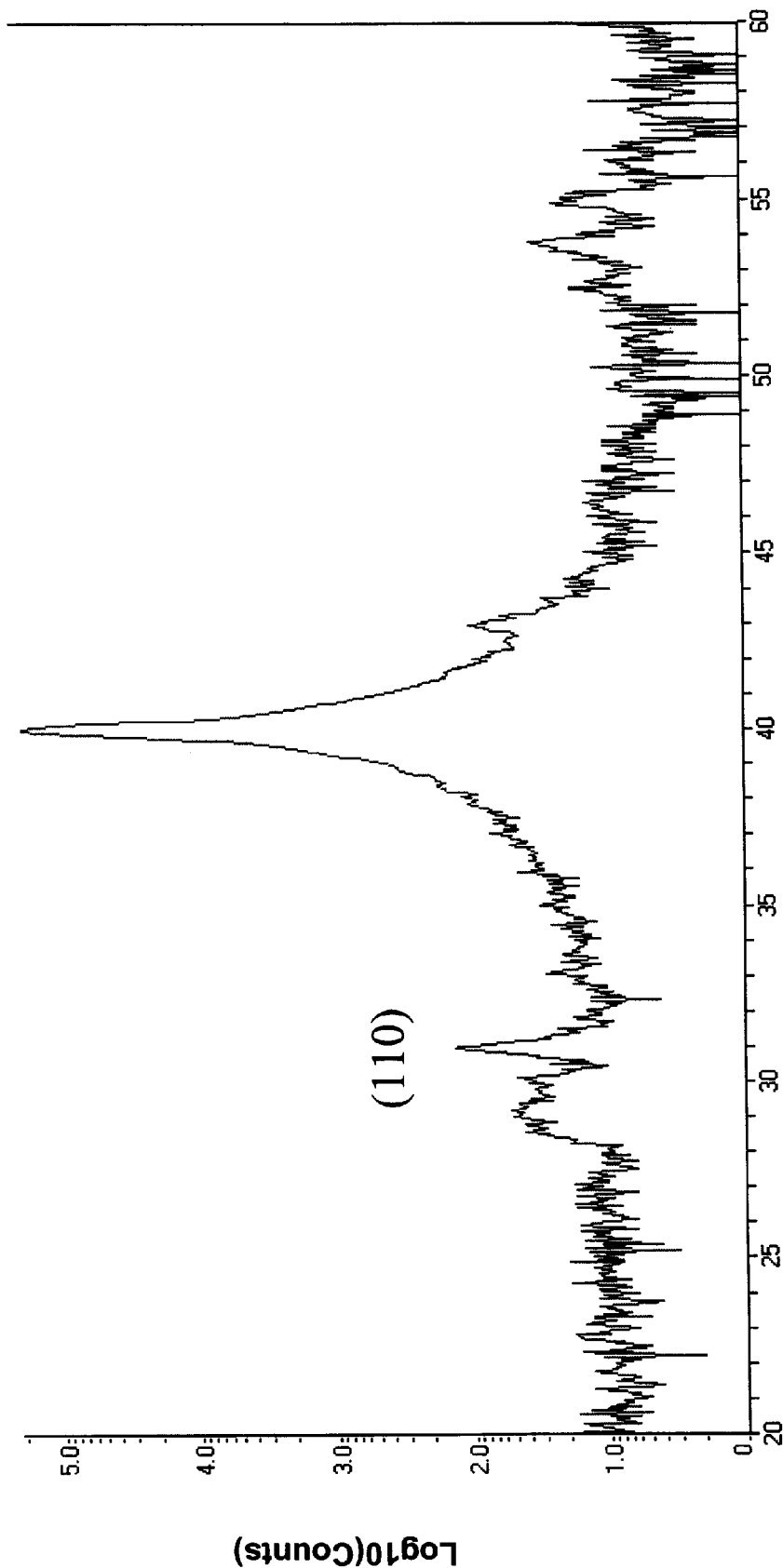
FIG. 4 shows a typical XRD pattern showing the thin film Ba—Nb—O perovskite phase.
Figure 5:
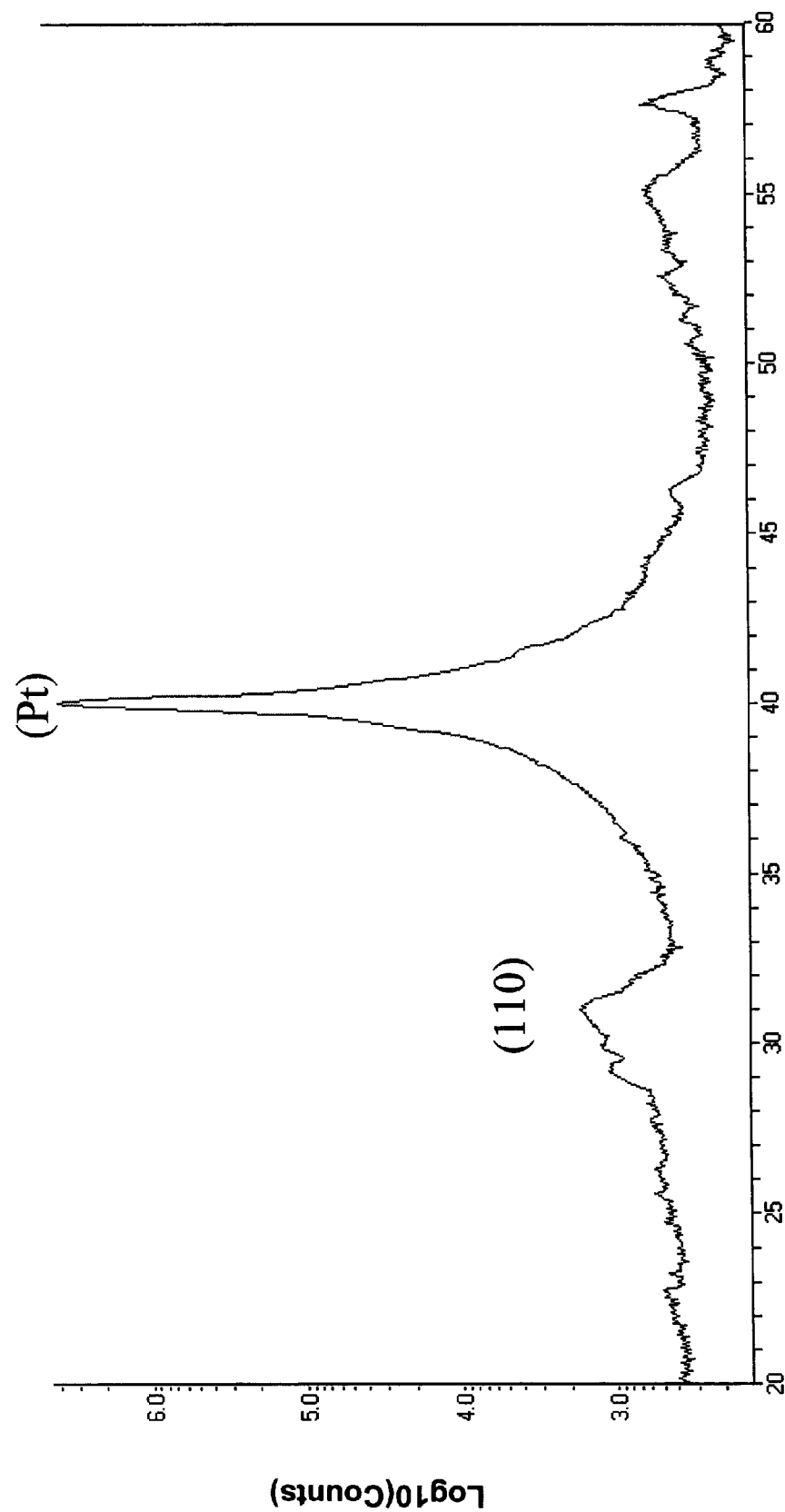
FIG. 5 shows a typical XRD pattern showing the thin film Ba—Ta—O perovskite phase.

In the present invention, new perovskite-phase materials as films on a substrate are disclosed as well as a method of preparation of these new materials. These perovskite-phase materials have the general formula $A_xB_yO_3$ where A and B are cations and O is the anion oxygen. Perovskite-phase materials include materials where A and B represent multiple elements; for example, $A_xB_yO_3$ includes materials of the form A'A"BO$_3$, AB'B"O$_3$ and A'A"B'B"O$_3$ where A', A", B', and B" are different metal elements.

Because the anion group, $O_3$, has a total negative charge of $-6$, the combined charge of the cations A and B in the perovskite crystalline structure must have a total positive charge of $+6$. In the present invention, A, A' and A" are cations from the Group II elements and have a positive charge of $+2$. B, B' and B" are cations from the Group V elements. Many Group V elements of the Periodic Table have multiple valence states, including valence states with a positive charge of $+3$ or $+5$. To obtain a perovskite phase of the general formula $A_xB_yO_3$, when A is selected form the Group II elements and B is selected from the Group V elements of the Periodic Table, the mole fractions x and y can be a fraction other than unity. Alternatively, the compound may be a perovskite phase structure deficient in the A cations or might have contamination from another ion to make the charge of the overall structural neutral.

As will be discussed more fully, analyses has shown that the perovskite phase materials of the present invention have an approximately 1:1 stoichiometry for the A and B cations, indicating that the materials of the present invention are not significantly deficient in the A cations. Analyses also demonstrated that no significant carbonate contamination (the most likely contaminant) was present. Available analytic data suggest that either the B cations exist in both the $+3$ and $+5$ valence states that are kinetically stabilized by the substrate onto which the thin film is placed or that the perovskite phase materials have an essentially equal A- and B-cation defect structure (such as $A_{6/7}B_{6/7}O_3$) where B is only in the $+5$ valence state. X-ray diffraction data show conclusively that the materials of the present invention are perovskite-phase structures. Additionally, the perovskite-phase materials of the present invention have been shown to exist only as thin films and do not exist as powders.

In the present invention, A, A', and A" are metal cations selected from Group II elements of the periodic table consisting of beryllium, magnesium, calcium, strontium, and barium, and preferably strontium and barium; and B, B', and B" are metal cations selected from niobium and tantalum. Extensive experimentation successfully formed perovskite thin films with only niobium and tantalum from the Group V elements, when combined with Group II metal cations as described in the Examples. Synthesis with bismuth and antimony, both Group V elements, was not successful in obtaining perovskite phase thin film materials; specifically SrBiO$_3$, BiTaO$_3$, BaBiO$_3$, and BiNbO$_3$ were not formed as perovskite-phase thin films. Even though both bismuth and antimony are Group V elements and can exist in both $+3$ and $+5$ valance states, this lack of success in forming perovskite-phase thin films is apparently because of other physical and structural characteristics of these elements.

Perovskite-phase thin films containing niobium and tantalum were successfully prepared in combination with metal cations with a $+2$ valance charge. In particular, SrNbO$_3$, SrTaO$_3$, Sr(Ta,Nb)O$_3$, BaNbO$_3$, and BaTaO$_3$, thin films were successfully prepared, as described in the Examples; these materials were determined to be perovskite-phase thin films, as determined by XRD analyses, shown in FIGS. 1, 2, 3, 4, and 5, respectively, where the perovskite phase is revealed by the presence of the (110) peak. Because the A, A' or A" cations of the present invention all have a stable $+2$ valence charge, any combination can be used.

In preparing the new compounds of the present invention, at least one element-A-containing compound, wherein A is a metal cation with a $+2$ valance charge, and preferably strontium or barium, is combined with at least one element-B-containing compound, wherein B is niobium or tantalum, to form a solution. A solvent is added to this solution to form a second solution. This solution is the perovskite-phase precursor. The solvent may be any organic solvent, such as acetic acid, that can effectively solubilize the A- and B-containing compounds. The thin film is formed on a substrate, preferably by spin-coating the second solution onto a substrate, although other techniques are possible and included within the scope of the invention. The substrate may be any standard substrate material such as quartz or metal, such as platinum, on silicon. Spin-coating the solution on the substrate may be performed using a photoresist spinner at approximately 3000 rpm for about 30 sec. The film is then heated to form the perovskite-phase thin film. The thin film may be heated to approximately 300° C. for about 5 minutes, followed by heating the film at approximately 725° C. or higher, thereby forming the perovskite phase.

In one embodiment, to prepare the Sr—Ta—O perovskite phase $Sr_xTa_yO_3$, $Ta(OCH_2CH_3)_5$, an oil, is added to the white powder of $Sr(O_2CCH_3)_2$ followed by addition of $HO_2CCH_3$. The reaction mixture is stirred until dissolution occurs (<15 min.) resulting in a slightly pale yellow solution. This mixture must be freshly synthesized before each use due to the "aging" of the solution caused by esterification. Films and powders of like-stoichiometry were produced from the same precursor solutions either by spin-coat deposition or removal of the volatile material by vacuum distillation. Powders were isolated by vacuum distillation of the volatile components and were found to be off-white in color. Films were clear and defect free both before and after processing. Both powder and film samples were processed under identical conditions.

Figure 6:
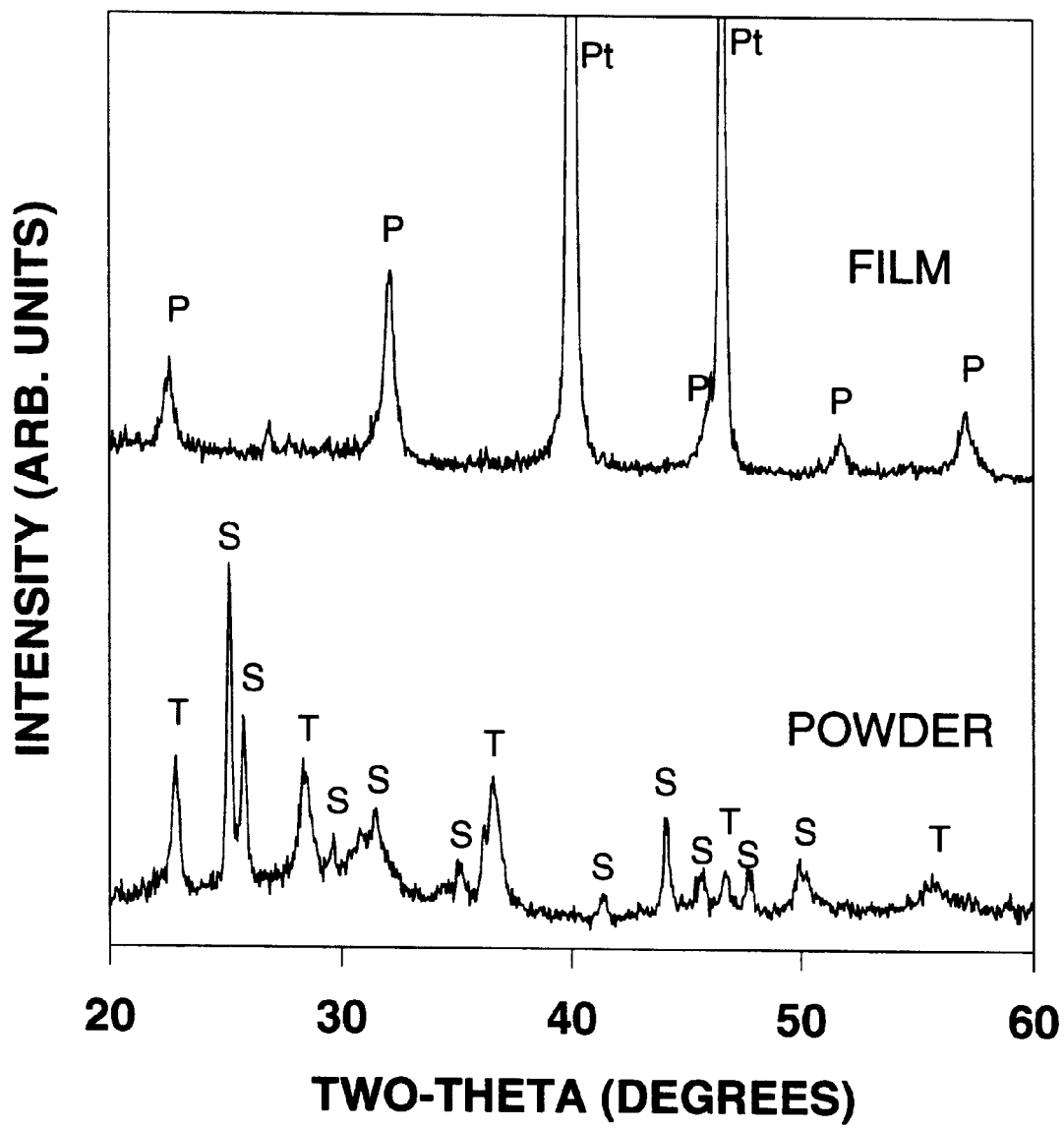
FIG. 6 shows the XRD patterns for both a prepared powder and thin film.

FIG. 6 displays the x-ray diffraction (XRD) pattern for both the powder and film diffraction data. As can be discerned from FIG. 6, the XRD pattern of the powder reveals the presence of a two-phases: SrCO$_3$ and Ta$_2$O$_5$, neither of then a perovskite phase. However, for the film sample, the diffraction pattern contains peaks representing a previously uncharacterized perovskite structure. Based on chemical composition, this must be $Sr_xTa_yO_3$.

Figure 7:
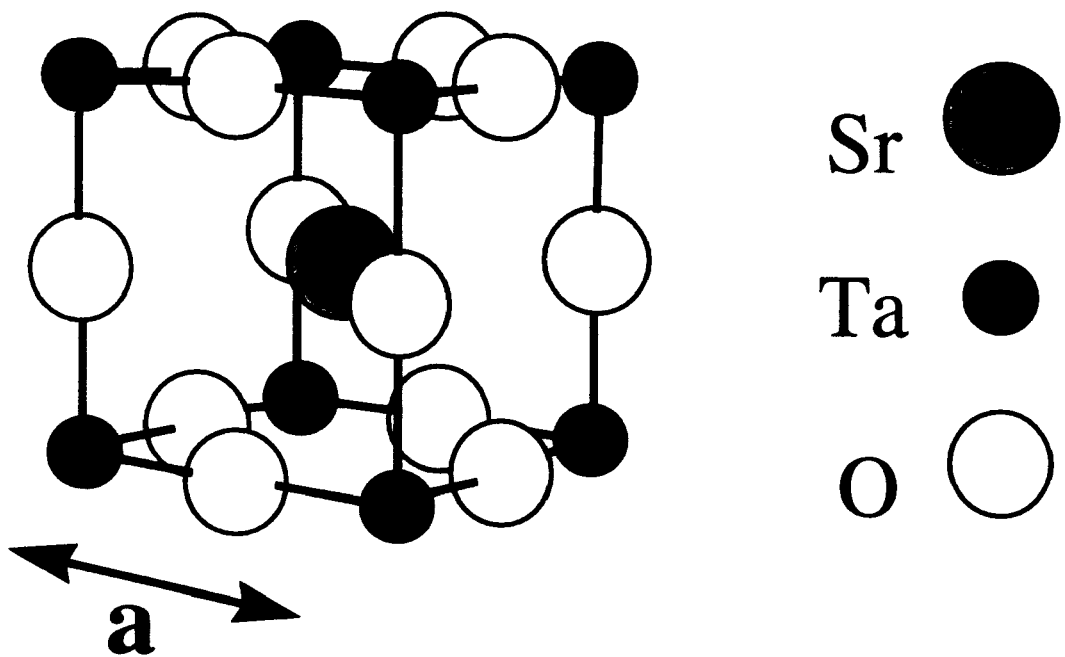
FIG. 7 shows the general structure for the Sr—Ta—O thin film perovskite phase structure.

The general structure of the Sr—Ta—O perovskite phase is shown in FIG. 7 and was solved in the Pm3m space group with a=3.955 (1)Å and V=61.86 Å$^3$ for Z=1. This structure follows the general formula for perovskite materials (ABX$_3$, where A and B represent metallic cations and X is a non-metal). Due to the high symmetry of this unit cell, the structure consists of a mirror reflections of Ta—O atoms which form a cube that is interwoven with a cube of Sr atoms. Using the oxygen atoms, the Sr and Ta cations adopt 12- and 6-coordinated environments, respectively.

In an attempt to quantify the Sr—Ta cation ratio that will result in the perovskite structure $Sr_xTa_yO_3$, 1-layer films were processed to 800° C. with systematically varying compositions of Sr (x=1.2–0.2, 0.2 intervals) while the Ta ratio was held constant at 1.0. Below the x=0.8 composition, the perovskite structure was not observed. Clear diffraction peaks for the perovskite phase are observed in the films at compositions ranging from x=0.8–1.2. From these data it was concluded that the best nominal composition to prepare the perovskite was the Sr(1):Ta(1) cation ratio.

Figure 8:
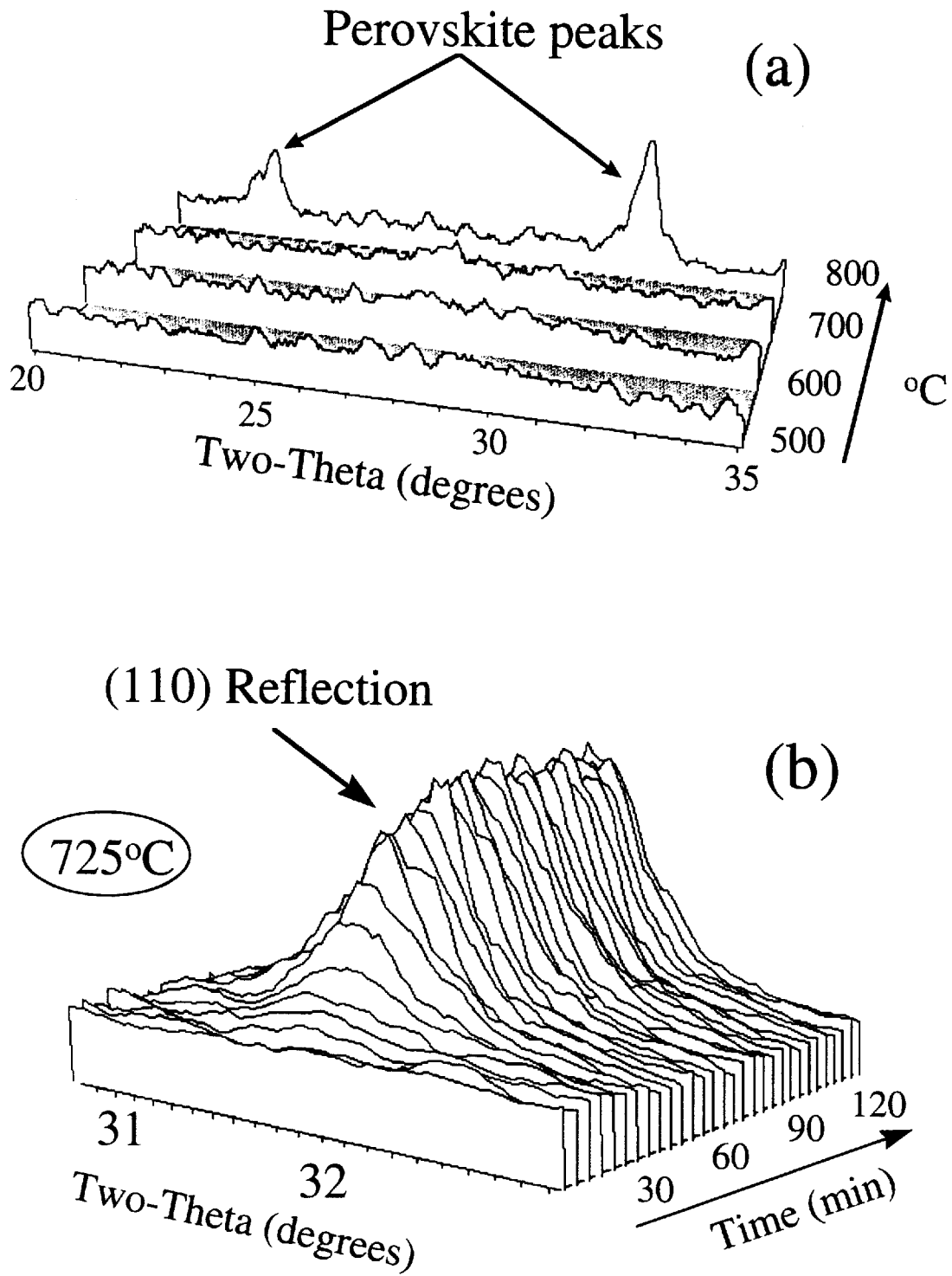
FIG. 8 shows the $SrTaO_3$ film behavior as a function of temperature.

Additional one-layer films were prepared at the nominal 1:1 composition for in-situ analysis. These samples were heat treated up to 300° C. (hot-plate treatment), to stabilize the resultant amorphous film against further reactions with ambient humidity, prior to monitoring the reaction of the film to heating using HTGIXRD. FIG. 8(a) illustrates the behavior of the film as a function of temperature, resulting from in-situ analysis of the film samples. As can be observed, an amorphous diffraction profile is recorded up to 700° C.; however, at higher temperatures (725° C.), the perovskite phase was clearly observed and became further crystalline at 800° C. The two peaks observed in FIG. 8(a) correspond to the (100) and (110) peaks. The film was very thin, (<1000 Å, 1-layer) which led to a low signal-to-noise ratio. FIG. 8(b) illustrates the diffraction data for a 725° C. isothermal treatment of the Sr(1):Ta(1) 1-layer film. The (110) reflection can be observed growing in as a function of time. Each diffraction scan required about four minutes to collect and the perovskite phase was found to fully crystallize in about one hour at 725° C. The temperature at which this novel phase was isolated is significantly lower than that observed for other Sr—Ta—O ceramic materials. Since the Rutile-type $TaO_2$ phase (having formally all Ta(IV) cations) was found to be stabilized only through the use of high-pressure via shock compression, stress is an important issue for the isolation of reduced Ta materials.

A compositional analysis of a 5-layer thick film was performed to address the question of final stoichiometry. XRD analysis indicated that the 5-layered film was consistent with that of the 1-layered film. This film was processed identically to previous samples, characterized via GIXRD to check for phase purity, and then cleaved in half. One half of the film was sent for compositional analysis while the other half was prepared for electrical measurements. The inductively coupled plasma—mass spectral results indicated a composition of Sr(1.0):Ta(1.01) or essentially a 1:1 cation ratio identical to the initial solution stoichiometry.

The electrical properties of the novel perovskite phase $Sr_xTa_yO_3$ were determined for potential applications. In order to perform electrical property measurement, platinum top electrodes were deposited on the 5-layered $Sr_xTa_yO_3$ film by a shadow mask technique. This forms the parallel plate Pt‖dielectric‖Pt capacitor. Electrical measurements indicated that this material had a dielectric constant k of ~16 with a tan d of 4%.

EXAMPLES

All compounds were handled under an inert atmosphere using standard Schlenk and glove box techniques, unless otherwise noted. The following precursors were handled and stored under inert atmospheres and used as received (Alfa, AESAR): $Ta(OCH_2Me)_5$ and $Sr(O_2CMe)_2$. $HO_2CMe$ (Fisher) was stored over, and distilled from, $CrO_3/O(OCMe)_2$.

Diffraction Studies to Determine Perovskite Phase

Ex-situ diffraction data for powder samples were collected using a Siemens D500 θ-2θ diffractometer equipped with $CuK_\alpha$ radiation, a graphite monochromator, and scintillation detector. Powders were mounted on zero-background holders. A typical scan range of 10–60° 2θ with a step-size of 0.05° 2θ, and count-time of 2 seconds were used. Grazing incidence X-ray diffraction (GIXRD) using a Siemens θ-2θ diffractometer equipped with CuKa radiation was employed for ex-situ analysis of film samples. Samples were analyzed using thin-film optics which employ a set of long soller receiving slits (0.4° slit spacing) and a LiF monochromator. Conditions for the diffraction scans were typically a 2.0° a angle, 0.3° divergence slits, 0.05° 2θ step-size, and count-time of 2 seconds. Scan parameters for data used in refinements were identical with the exception of step-size and count-time which were 0.02° 2θ and 30 seconds, respectively. A set of incident beam soller slits was also employed on the divergent beam side to discourage beam divergence at the sample.

Top platinum electrodes (150 mm in diameter) were deposited using a shadow mask to create a parallel-plate Pt‖dielectric‖Pt capacitor. The electrical properties of the perovskite-phase films were measured using an RT66A ferroelectric tester from Radiant Technologies. The dielectric properties were measured using an HP 4194A impedance analyzer.

Example 1

Sr—Ta—O Perovskite Thin Film

In a vial, $Ta(OCH_2Me)_5$ (0.304 g, 0.749 mmol) was added to $Sr(O_2CMe)_2$ (0.154 g, 0.749 mmol), followed by addition of 3.0 mL of $HO_2CMe$. The resulting approximately 0.25 M slurry was stirred for 15 minutes or until clear to form a solution. This solution was used without further modifications. Other solutions were prepared in an analogous manner according to the following ratios of $Sr_xTa_{1.0}$ where x=1.2, 1.0, 0.8, 0.6, 0.4, and 0.2. Powders were generated by removal of all the volatile material in vacuo ($10^{-3}$ Torr).

Single and multi-layered films of the desired composition were spin-coat deposited by standard methods, in air, onto Pt-coated $SiO_2/Si$ substrates using a photoresist spinner, (3000 rpm for about 10 to 30 seconds). Other substrates may be used. After each deposition, the films were baked on a hot plate (at approximately 300° C. for about 5 minutes) to facilitate drying and remove organic constituents. Heat treatments (at approximately 800° C. in air) of film samples were performed in a tube furnace to form the perovskite phase, $Sr_xTa_yO_3$, as a thin film. Some films were only processed up through the hot-plate treatment and then processed/monitored in-situ using high-temperature, grazing incidence X-ray diffraction (HTGIXRD).

Example 2

Sr—Nb—O Perovskite Thin Film

In a vial, $Nb(OCH_2Me)_5$ (0.2374 g, 0.584 mmol) was mixed with HOAc (0.2175 g, 0.535 mmol). The mixture was added to $Sr(O_2CMe)_2$ (0.154 g, 0.750 mmol). The resulting approximately 0.25 M slurry was stirred for 15 minutes or until clear to form a solution. This solution was used without further modifications. A thin film sample was prepared of the strontium-niobium-oxide material, spinning each layer at 3000 RPM and heating at 300° C. for approximately five minutes. Heat treatment at approximately 800° C. in air (any oxygen environment can be used) was performed for each layer in a tube furnace to form the perovskite phase, $Sr_xNb_yO_3$, as a thin film.

Example 3

Sr—Ta—Nb—O Perovskite Thin Film

In a vial, $Nb(OCH_2Me)_5$ (0.1176 g, 0.370 mmol) was mixed with $Ta(OCH_2Me)_5$ (0.1519 g, 0.374 mmol) and HOAc (2.175 g). The mixture was added to $Sr(O_2CMe)_2$ (0.1538 g, 0.750 mmol). The resulting approximately 0.25 M slurry was stirred for 15 minutes or until clear to form a solution. This solution was used without further modifications. A thin film sample was prepared of the strontium-niobium-oxide material, spinning each layer at 3000 RPM and heating at 300° C. for approximately five minutes. Heat treatment at approximately 800° C. in air (any oxygen environment can be used) was performed for each layer in a tube furnace to form the perovskite phase, $Sr_x(Ta,Nb)_yO_3$, as a thin film.

Example 4
Ba—Ta—O Perovskite Thin Film

In a vial, Ta(OCH$_2$Me)$_5$ (0.3041 g) was mixed with HOAc (2.1735 g). The mixture was added to 0.1914 g of Ba(OAc)$_2$. The resulting approximately 0.25 M solution was stirred. The solution was used without further modifications. Two samples were prepared of 3-layer films of the barium-tantalum material, spinning each layer at 3000 RPM and heating at 300° C. for approximately five minutes. Heat treatment at approximately 800° C. in air (any oxygen environment can be used) was performed for each layer in a tube furnace to form the perovskite phase, Ba$_x$Ta$_y$O$_3$, as a thin film.

Example 5
Ba—Nb—O Perovskite Thin Film

In a vial, Nb(OEt)$_5$ (0.2380 g) was mixed with HOAc (2.1765 g). The mixture was added to 0.1917 g of Ba(OAc)$_2$. The resulting approximately 0.25 M solution was stirred. The solution was used without further modifications. A 3-layer film of the barium-niobium material was made, spinning each layer at 3000 RPM and heating at 300° C. for approximately five minutes. Heat treatment at approximately 800° C. in air (any oxygen environment can be used) was performed in a tube furnace for approximately 30 minutes, ramping down the temperature for the third layer and turning the oxygen off at about 600° C. This procedure formed the perovskite phase, Ba$_x$Nb$_y$O$_3$, as a thin film.

Example 6
Ba—Nb—O Perovskite Thin Film

In a vial, Nb(OEt)$_5$ (0.2388 g) was mixed with HOAc (2.1777 g). The mixture was added to 0.1919 g of Ba(OAc)$_2$. The resulting approximately 0.25 M solution was stirred. The solution was used without further modifications. 1-layer, 2-layer, and 3-layer film of the barium-niobium material were made, spinning each layer at 3000 RPM and heating at 300° C. for approximately five minutes. The first and second layers of the 3-layer film and the first layer on the 2-layer film were fired at 800° C. for 30 minutes under an oxygen-containing atmosphere. The final layer on each film (1-, 2-and 3- layer) was fired for three hours at 800° C. and then ramped down, all under oxygen. Multilayer films of the Ba—Nb—O perovskite phase were thus prepared.

The invention being thus described, it will be apparent that the same may be varied in many ways. Such variations are not to be regarded as a departure from the spirit and scope of the invention, and all such modifications as would be apparent to one skilled in the art are intended to be included within the scope of the following claims.

We claim:

1. A perovskite-phase thin film on a substrate, comprising:

a material of the formula A$_x$B$_y$O$_3$, wherein A is selected from strontium and barium or a combination thereof; and B is selected from niobium and tantalum or a combination thereof; wherein said material of the formula exists as a perovskite-phase thin film.

2. A perovskite-phase thin film of claim 1, wherein:

the thin film comprises the general formula A$_x$B$_y$O$_3$, wherein x is a mole fraction between approximately 0.8 and approximately 1.2 and y is a mole fraction between approximately 0.8 and approximately 1.2.

3. The perovskite-phase thin film of claim 2, wherein:

A is strontium and B is niobium.

4. The perovskite-phase thin film of claim 2, wherein:

A is strontium and B is tantalum.

5. The perovskite-phase thin film of claim 2, wherein:

A is strontium and B is an approximately equimolar combination of tantalum and niobium.

6. The perovskite-phase thin film of claim 2, wherein:

A is barium and B is niobium.

7. The perovskite-phase thin film of claim 2, wherein:

A is barium and B is tantalum.

8. The perovskite-phase thin film of claim 2, wherein:

A is strontium and B is an approximately equimolar combination of tantalum and niobium.

9. A perovskite-phase thin film of the general formula A$_x$B$_y$O$_3$, wherein:

A is strontium or barium or a combination thereof;

B is niobium or tantalum or a combination thereof;

x is between approximately 0.8 and approximately 1.0; and y is between approximately 0.8 and approximately 1.0.

10. The perovskite-phase thin film of claim 1 wherein the thin film has the structure shown in FIG. 7 with a=3.955 Å and V=61.86 Å$^3$ for Z=1.

* * * * *